United States Patent
Vaswani et al.

(10) Patent No.: US 9,263,915 B2
(45) Date of Patent: *Feb. 16, 2016

(54) DETERMINING ELECTRIC GRID ENDPOINT PHASE CONNECTIVITY

(75) Inventors: Raj Vaswani, Portola Valley, CA (US); Jana van Greunen, Redwood City, CA (US); Alexander Gostrer, Sunnyvale, CA (US)

(73) Assignee: SILVER SPRING NETWORKS, INC., Redwood City, CA (US)

( * ) Notice: Subject to any disclaimer, the term of this patent is extended or adjusted under 35 U.S.C. 154(b) by 841 days.

This patent is subject to a terminal disclaimer.

(21) Appl. No.: 13/480,950

(22) Filed: May 25, 2012

(65) Prior Publication Data

US 2012/0232844 A1    Sep. 13, 2012

Related U.S. Application Data

(63) Continuation of application No. 12/472,622, filed on May 27, 2009, now Pat. No. 8,207,726.

(60) Provisional application No. 61/094,728, filed on Sep. 5, 2008.

(51) Int. Cl.
    *G01R 19/00*    (2006.01)
    *H02J 13/00*    (2006.01)
    (Continued)

(52) U.S. Cl.
    CPC ............ *H02J 13/0048* (2013.01); *G01R 29/18* (2013.01); *H02J 3/00* (2013.01); *H02J 2003/002* (2013.01); *Y02E 60/783* (2013.01); *Y04S 40/123* (2013.01)

(58) Field of Classification Search
    CPC ........ G01R 29/18; H02J 3/00; H02J 13/0048; H02J 3/002; Y02E 60/783; Y04S 40/123
    USPC ........................................................... 324/66
    See application file for complete search history.

(56) References Cited

U.S. PATENT DOCUMENTS 5,055,769 A  *  10/1991  Gentile ................. G01R 29/18
                                                    324/86
5,068,576 A      11/1991  Hu et al.
(Continued)

FOREIGN PATENT DOCUMENTS

JP    2006-047020 A    2/2006
TW      200624825       7/2006
(Continued)

OTHER PUBLICATIONS

Invitation to Pay Additional Fees and Partial Search Report dated Feb. 15, 2010, issued in corresponding International Application No. PCT/US2009/004816.
(Continued)

*Primary Examiner* — Benjamin M Baldridge
(74) *Attorney, Agent, or Firm* — Buchanan Ingersoll & Rooney PC

(57) ABSTRACT

The service phase of the electrical connection to a customer endpoint device located within a power distribution system is determined by various techniques. At the feeder level, the system may be programmed to induce disturbances, thereby causing missed zero crossings at the customer endpoint devices. The pattern of these disturbances is a controlled one, designed specifically to avoid causing noticeable disruption even to sensitive devices, but to be unusual enough that it is statistically unlikely to be naturally occurring. The monitoring of the zero crossing information is used to determine the phase of the service line to the customer endpoint devices.

10 Claims, 8 Drawing Sheets

(51) Int. Cl.
*G01R 29/18* (2006.01)
*H02J 3/00* (2006.01)

(56) References Cited

U.S. PATENT DOCUMENTS

| | | | |
|---|---|---|---|
| 5,467,011 A * | 11/1995 | Hunt | G01R 29/18 324/107 |
| 5,493,206 A | 2/1996 | Boons | |
| 5,510,700 A | 4/1996 | Pomatto | |
| 5,592,353 A | 1/1997 | Shinohara et al. | |
| 5,617,329 A * | 4/1997 | Allison | G01R 29/16 307/3 |
| 6,072,858 A * | 6/2000 | Bellin | H04B 3/54 340/12.32 |
| 6,798,211 B1 * | 9/2004 | Rockwell | G01R 31/085 324/527 |
| 7,525,423 B2 | 4/2009 | Berkman et al. | |
| 8,013,592 B2 | 9/2011 | Giubbini et al. | |
| 8,665,102 B2 * | 3/2014 | Salewske | G01R 19/2513 324/522 |
| 2003/0016004 A1 * | 1/2003 | Jungwirth | G01R 19/2513 324/113 |
| 2003/0184275 A1 | 10/2003 | Slade et al. | |
| 2005/0099314 A1 * | 5/2005 | Aisa | H02J 3/14 340/637 |
| 2010/0237852 A1 * | 9/2010 | Tazzari | G01R 29/18 324/86 |
| 2011/0130992 A1 * | 6/2011 | Kolwalkar | G01R 29/18 702/72 |

FOREIGN PATENT DOCUMENTS

| | | |
|---|---|---|
| WO | 2005/116668 A1 | 12/2005 |
| WO | 2005116668 A1 | 12/2005 |
| WO | WO 2006100695 A1 * | 9/2006 ............. G01R 29/18 |

OTHER PUBLICATIONS

International Search Report and Written Opinion dated Apr. 8, 2010, issued in corresponding International Application No. PCT/US2009/004816.
Office Action from Taiwanese Patent Office dated Oct. 29, 2012, issued in corresponding Taiwanese Patent Application No. 98129662.
Office Action from State Intellectual Property Office of the People's Republic of China dated Nov. 7, 2012, issued in corresponding Chinese Patent Application No. 200980141062.1, with English translation thereof.
Office Action from the Japan Patent Office dated Sep. 13, 2013, issued in corresponding Japanese Patent Application No. 2011-526033, with English translation thereof. (3 pages).
Office Action issued by the Canadian Patent Office on Jul. 14, 2015 in corresponding Canadian Application No. 2,736,000 (4 pages).

* cited by examiner

DETERMINING ELECTRIC GRID ENDPOINT PHASE CONNECTIVITY

RELATED APPLICATION

This application is a continuation of U.S. application Ser. No. 12/472,622, filed May 27, 2009, which claims the benefit of prior Provisional Application No. 61/094,728 filed on Sep. 5, 2008, both of which are hereby incorporated by reference in their entireties.

FIELD OF THE INVENTION

Exemplary embodiments relate generally to the determination of the service phase of the electrical connection to a customer end-point located within a power distribution system.

BACKGROUND OF THE INVENTION

Electric power is generated at a power station and transmitted through a transmission network of high voltage lines. These lines may be hundreds of miles in length, and deliver the power into a common power pool called a "grid." The grid is connected to load centers (e.g., cities) through a sub-transmission network of normally 33 kV (or sometimes 66 kV) lines.

FIG. 1 is a diagram illustrating a conventional power transmission and distribution system. This diagram is an example of one of variety of known grid topologies and is provided for illustration purposes. Referring to FIG. 1, high voltage lines terminate in a 33 kV (or 66 kV) substation, where the voltage is stepped-down to about 11 kV for power distribution to load points through a distribution network of lines at 11 kV and lower. The power network is the distribution network of 11 kV lines or feeders downstream of the substation. Each 11 kV feeder which emanates from the 33 kV substation branches further into several subsidiary 11 kV feeders to carry power close to the load points (localities, industrial areas, villages, etc.). At these load points, a transformer further reduces the voltage from 11 kV to 415V to provide the last-mile connection through 415V feeders to individual customers, either at 240V (as a single-phase supply) or at 415V (as a three-phase supply). A feeder could be either an overhead line or an underground cable.

At the feeder level, the electric grid is polyphase (i.e., having multiple lines for different phases). At a customer endpoint that takes in a single phase (e.g., a residence), a physical line connects to a meter located at the customer endpoint. However, when the customer endpoint is physically connected, it may not necessarily be known at that time which phase at the feeder level corresponds to the line at the customer endpoint to which the meter is being connected. This could be because the utility may have never had that information, or it may not have been kept up to date since physical grid topology is typically modified over time. Further, if there is a power outage, or if the power is shut down so that a new transformer can be installed, there is no guarantee that the meter at the customer endpoint device will be on the same phase as it was previously.

The utility can calculate losses and theft by comparing the usage at the feeder level with aggregated usage on the customer side. But without knowledge of the real grid topology, this information could be at least three times less accurate. As the customer density served by a feeder increases, this inaccuracy may increase, and thus, may result in an increased loss of power and revenue to the utility.

SUMMARY OF THE INVENTION

Exemplary embodiments relate generally to methods of determining the service phase of the electrical connection to a customer end-point located within a power distribution system.

The embodiments disclosed herein assume the presence and use of an ad-hoc wireless network that includes network nodes at the meter locations, sub-stations, and other elements of the electric-grid infrastructure, and are connected to the utility server via relays and access points (APs). Nodes exchange messages with each other and other network elements over wireless links of the network. In some other embodiments, messages between nodes may be exchanged via non-networked direct communications links.

According to an exemplary embodiment, a method of determining the service phase of a customer endpoint device in a power distribution system may comprise sending a message to a substation requesting the substation to create a temporary power interruption on one of a plurality of phases of a feeder line to the substation. A report is received from at least one of a plurality of customer endpoint devices indicating whether the power interruption was detected by a respective customer endpoint device. The customer endpoint device that reported the detection of the power interruption is mapped to the respective phase that the power interruption was created on.

According to another exemplary embodiment, a method of determining a service phase of a customer endpoint device in a power distribution system may comprise identifying a plurality of customer endpoint devices that communicate directly with a single AP, and synchronizing the plurality of customer endpoint devices temporarily with the AP. The last zero-crossings are detected in alternating current (AC) within a predetermined time period at each customer endpoint device. The relative phase difference of the plurality of customer endpoint devices is measured, based on timestamps of the detected last zero-crossings. The service phase of each customer endpoint device is determined, based on the measured relative phase difference.

According to another exemplary embodiment, a method of determining a service phase of a customer endpoint device in a power distribution system may comprise sending, from a host, a request to the customer endpoint device requesting zero-crossing delta data detected at the customer endpoint device. At the host, a response message is received from the customer endpoint device. This message includes zero-crossing delta data detected at the customer endpoint device, indicating the difference between the time when a last zero-crossing was detected at the customer endpoint device and when the response message was created by the customer endpoint device.

The method further comprises calculating zero-crossing delta data detected at the host, indicating the difference between the time when a last zero-crossing was detected at the host and the time when the response message was received by the host. A phase shift from the customer endpoint device is calculated, based on the zero-crossing delta data detected at the customer endpoint device, the calculated zero-crossing delta data detected at the host, a message latency time, and a frequency period of a feeder line electrically connected to the customer endpoint device. The service phase of the customer endpoint device is determined based on the calculated phase shift.

According to another exemplary embodiment, a method of determining a service phase of a customer endpoint device in a power distribution system may comprise sending a request from a first customer endpoint device to a neighboring endpoint device, requesting zero-crossing delta data detected at the neighboring device. At the first customer endpoint device, a response message is received from the neighboring device including the zero-crossing delta data detected at the neighboring device. This message indicates the difference between the time when a last zero-crossing was detected at the neighboring device and when the response message was created by the neighboring device.

BRIEF DESCRIPTION OF THE DRAWINGS

Exemplary embodiments will be more clearly understood from the following detailed description taken in conjunction with the accompanying drawings.

FIG. 1 is a diagram illustrating a conventional power transmission and distribution system.

FIG. 2 is a schematic diagram of a wireless communication network of a power distribution system in which exemplary embodiments may be implemented.

FIG. 3 is a schematic diagram of a power transmission and distribution network in which exemplary embodiments may be implemented.

FIG. 4 is a state diagram illustrating how the customer endpoint devices detect momentary failures according to an exemplary embodiment.

FIG. 5 is a diagram illustrating the "get zero-crossing delta" message exchange between a host system and a customer endpoint device according to an exemplary embodiment.

FIG. 6 is a diagram illustrating an example of phase detection by the host system according to an exemplary embodiment.

FIG. 7 is a diagram illustrating the "get zero-crossing delta" message exchange between a customer endpoint device and a direct neighbor according to an exemplary embodiment.

FIG. 8 is a diagram illustrating an example of phase detection by the direct neighbor according to an exemplary embodiment.

DETAILED DESCRIPTION

For simplicity and illustrative purposes, the principles of the invention are described by referring mainly to exemplary embodiments thereof.

Figure 1:
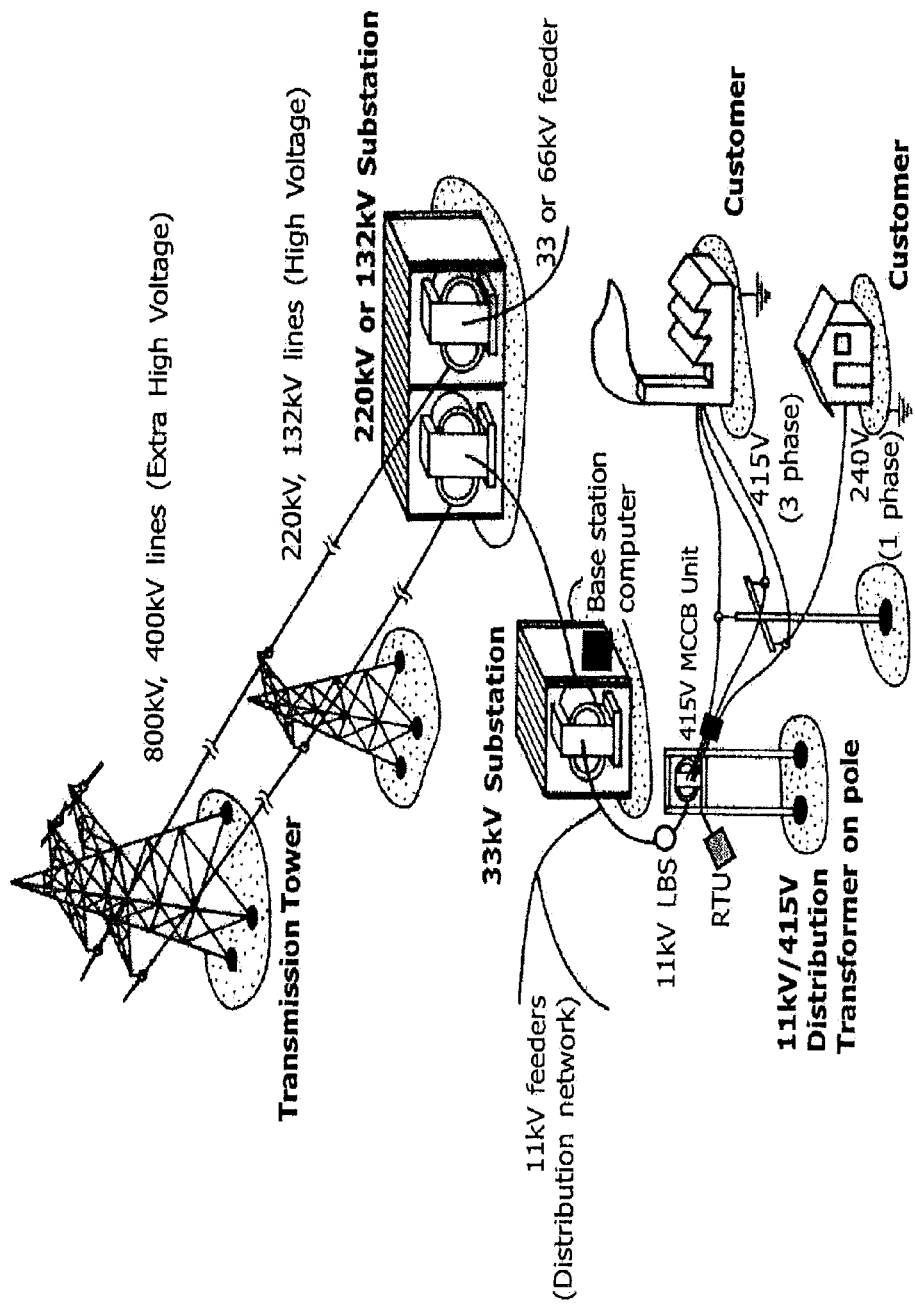
FIGS. 1-8 represent non-limiting, exemplary embodiments as described herein.
Figure 2:
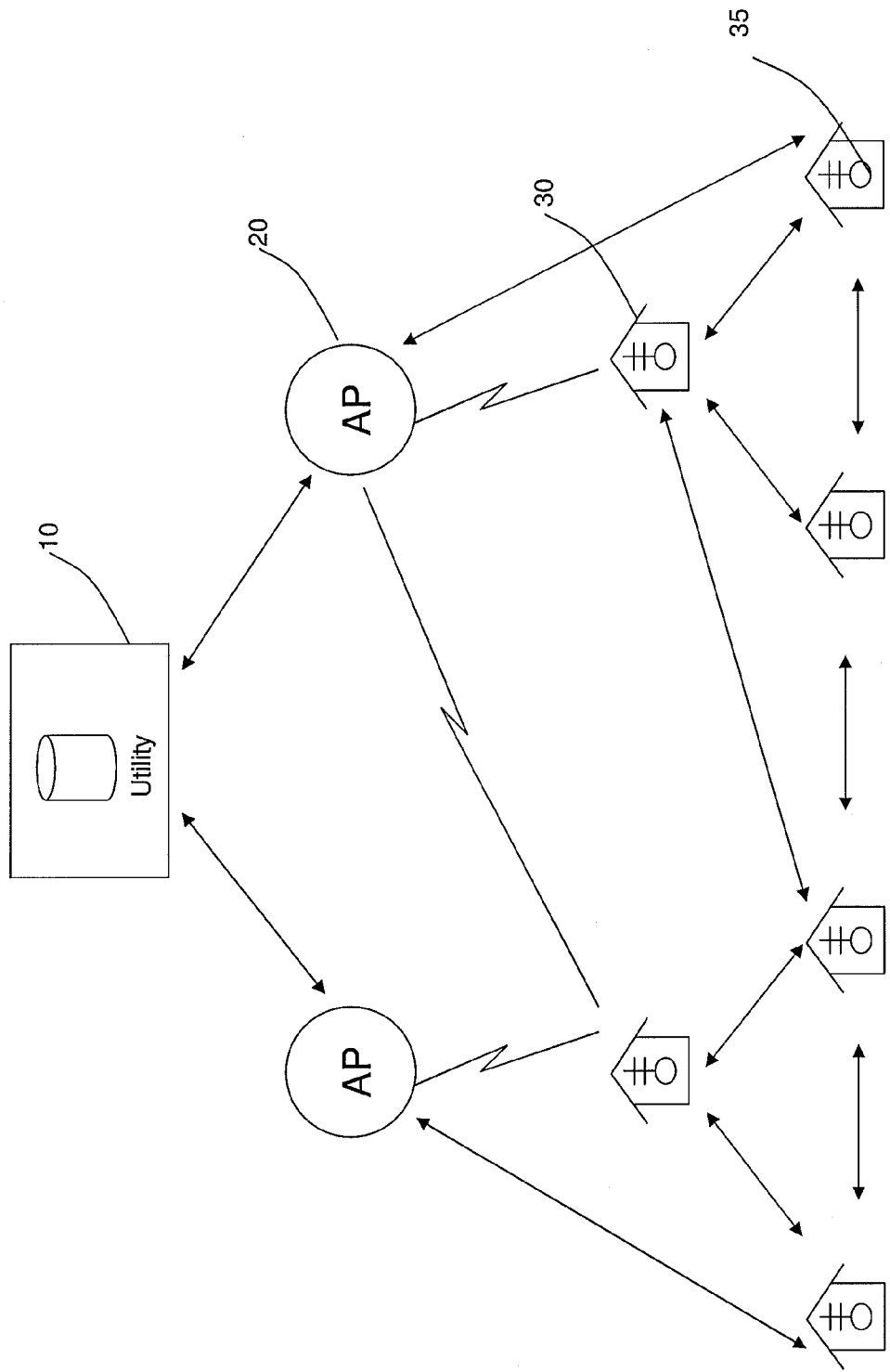

FIG. 2 is a schematic diagram of a wireless communication network of a power distribution system in which exemplary embodiments may be implemented. The communication network may include a utility back office server 10, a gateway access point (AP) 20, and a plurality of customer endpoint devices 30. The back office server 10 controls communication between the utility and the customer endpoint devices 30 and receives information (e.g., utilization data, power loss reports, and other similar information) from the customer endpoint devices 30. The AP 20 connects to the utility via a WAN (wide area network), the Internet, cellular, or any other network (wired, wireless, optical, etc.), and serves as the direct communication point to the customer endpoint devices 30. The endpoint devices 30 may connect to the AP 20 via a wired, wireless, or optical LAN (local area network). The endpoint devices 30 may be connected to each other and the AP using mesh network topology. Other networking topologies may be used in some embodiments.

There can be more than one AP 20 connecting to the utility in the communication network. Some of the customer endpoint devices 30 may be able to communicate directly with a particular AP 20, whereas other customer endpoint devices 30 may not be able to directly communicate with that particular AP 20 due to distance, for example. Those customer endpoint devices 30 that are too far from the particular AP 20 may communicate with the AP 20 via neighboring endpoint devices 30 that are closer to that particular AP 20 by the concept of "hopping." "Hopping" from node to node until the destination is reached allows for continuous connections and communication between the customer endpoint devices 30 and one or more of the APs 20. Likewise, an AP 20 may communicate with a remotely located customer endpoint device 30 via neighboring customer endpoint devices 30 located closer to the AP 20. In some other embodiments, a device 30 not capable of connecting to one AP 20 may connect to another AP 20 to reach the utility server.

A customer endpoint device 30 (i.e., an electric meter 35 with a network interface card (NIC)) is capable of detecting, logging, and reporting momentary voltage interruptions. This may be done by either the NIC or the meter 35.

Momentary voltage interruption is a power line event where only a few cycles of power are missing. Thus, the power quality may be affected only minimally, and the meter 35 or the NIC is not forced to reboot. The customer endpoint device is capable of detecting, logging, and reporting missed zero crossings in alternating current (AC).

"Zero crossing" in alternating current (AC) is the instantaneous point at which there is no voltage present. In other words, the AC line polarity changes. An electronic circuit and a processor can detect when the AC power line voltage changes its polarity from negative to positive and/or from positive to negative. An example circuit may include an attenuator with an amplifier followed by a comparator. The output of this electronic circuit is usually connected to an interrupt pin of the processor that gets interrupted each time the AC voltage changes its polarity. This detector may be used to determine the AC voltage frequency. The power line frequency has relatively high stability. Missing of one or more zero crossings in a certain time interval means that the AC frequency may have changed, but more likely that the power may have been interrupted.

Figure 3:
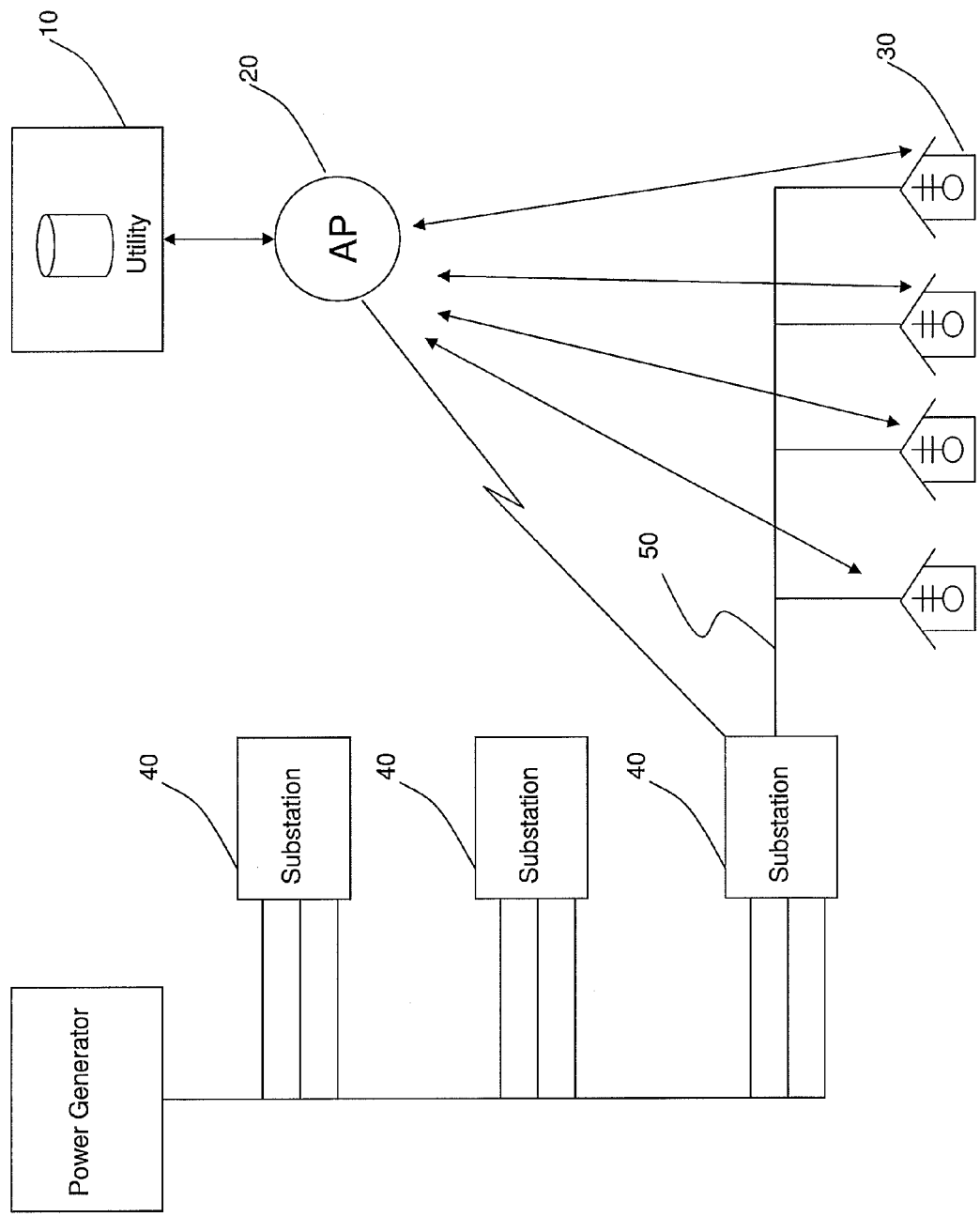

Referring to FIG. 3, monitoring of zero crossing information may be used to determine the phase of the service line to a customer endpoint device 30. At the substation 40 (i.e., feeder level), the system may be programmed to induce momentary power interruptions, thereby causing missed zero crossings at the customer endpoint devices 30. The pattern of these interruptions is a controlled one, designed specifically to avoid causing noticeable disruption even to sensitive devices, but to be unusual enough that it is statistically unlikely to be naturally occurring. The power interruptions are not limited to being induced at the substation 40 or at a location downstream of the substation 40. One of ordinary skill in the art will appreciate that the power interruptions may also be induced at locations upstream of the substation 40.

The naturally occurring "flickers" on a given feeder line 50 may be monitored before deriving the appropriate interruption pattern for that feeder 50. The utility back office server 10 may be used to analyze the power interruptions over distribution feeders 50 in the electric grid to derive a model of natural patterns pertinent to any one feeder 50 or all of the feeders 50. Then, the back office server 10 may be programmed to create the interruption pattern for a feeder 50 of interest. The interruption pattern for feeder 50 may be inserted to the feeder 50 directly or to any equivalent line upstream or downstream. Specifying the insert point should conform to the requirement that the interruption pattern reaches the end device 30 without significant changes. In other words the number and the length of inserted interruptions should be the same at the insert point and at the end device 30.

Since there are multiple phases originating from a feeder 50, the interruptions may be induced serially on each phase of the feeder 50. For example, the simulated flickers may be induced on Phase 1 on Day 1, on Phase 2 on Day 2, and so on. This test may be implemented either manually by providing the necessary test pattern to utility personnel or in a more automated fashion by "tickling" a DA/SCADA (Distribution automation/supervisory control and data acquisition) system. The automated test may be controlled by the utility back office server 10 if the network has e-bridges connected to feeder controls that allow the test to be done over the network, or by feeding appropriately formatted messages to a test system that may be connected to the electric grid at any of the grid elements (for example: sub-station, high voltage transformer, distribution transformer, etc.) specifically designed to induce test patterns.

During the test period, the customer endpoint devices 30 on that particular feeder 50 are programmed to log the flickers, and report that information to the back office server 10. The back office server 10 has the information pertaining to which flicker pattern was tested and on which phase. Based on the reports received from the customer endpoint devices 30, the back office server 10 will be able to link the devices 30 noticing and reporting a particular flicker pattern on Day 1 to a particular phase (Phase 1, for example). This process is repeated for reports received on each of the test days until all of the devices 30 on the feeder 50 are phase-mapped. If there are irregularities or errors from the reporting data from certain devices 30 that links them with more than one phase or with no particular phase at all, the test may be repeated until the uncertainty is removed. The repeat test also serves to confirm the original findings. The test may be repeated on each feeder 50 as often as necessary to obtain complete phase-mapping.

The test may be conducted over all feeders 50 either serially or in parallel, and may be repeated periodically for the entire network covering all of the installed customer endpoint devices 30. From these tests, a full phase connectivity model can be developed for the entire grid within the network.

Figure 4:
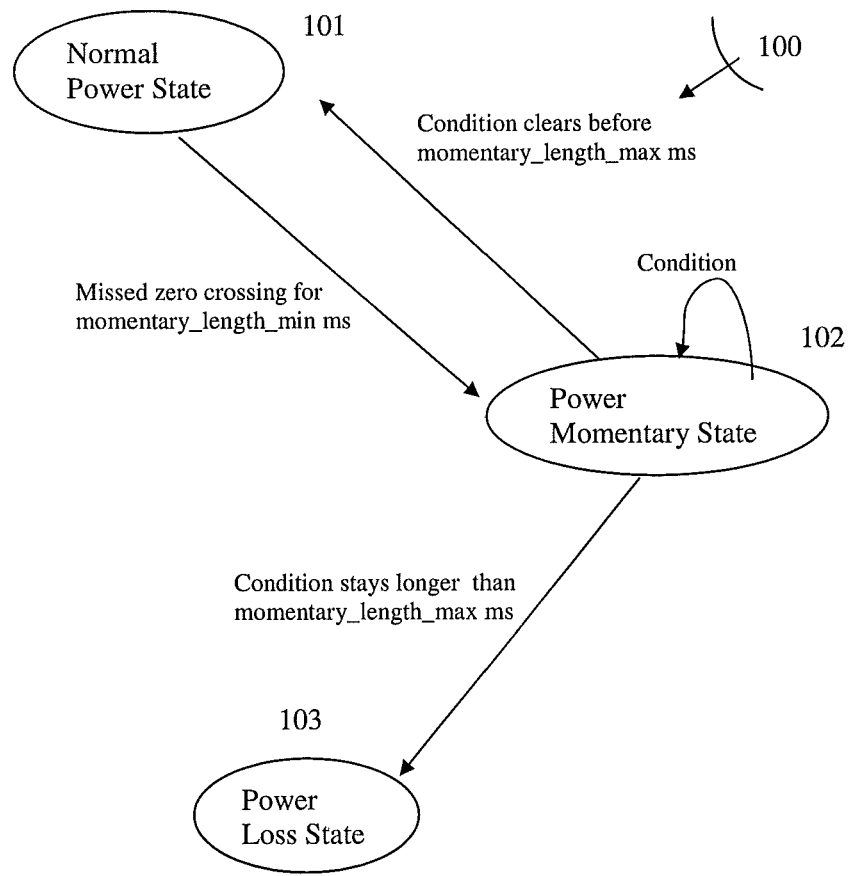

FIG. 4 is a state diagram illustrating how the customer endpoint devices detect momentary failures according to an exemplary embodiment. In the power interrupt detection process 100, initially a device will be operating in Normal Power State 101. As the back office server initiates the power interrupt process, the customer endpoint device measures zero crossings for this interrupt "momentary" period. "Momentary" means a single power interruption for a duration less than a maximum period, momentary_length_max, (e.g., 100 ms), but longer than some minimum period, momentary_length_min, (e.g., 30 ms). Momentary minimum duration (momentary_length_min) is the minimum elapsed time for a power interruption to be logged. When the meter at the customer endpoint device detects a single power interruption that is longer than momentary_length_min, the device operates in Power Momentary State 102. During this state, the device measures zero-crossing data, e.g. records the interval between each detected zero crossing during the time it is in this state, and reports the measured data to the back office server 10.

Momentary maximum duration (momentary_length_max) is the maximum elapsed time for a power interruption to be logged. When the meter at the customer endpoint device detects a single power interruption that is longer than momentary_length_max, the device recognizes this as the Power Loss State 103. Outages exceeding the momentary_length_max time period cause the NIC to shut down, and the meter at the customer endpoint device will try rebooting once it regains power.

Table 1 lists exemplary time periods for the momentary minimum duration and the momentary maximum duration. These time periods are determined so that a momentary power interruption is sufficiently long to cause a device to enter the Power Momentary State, but not so long as to cause the device to treat the interruption as a loss of power and react accordingly.

TABLE 1

| Configurable Variable | Minimum Value | Maximum Value | Default Value |
|---|---|---|---|
| Momentary Minimum Duration | 30 ms | 100 ms | 30 ms |
| Momentary Maximum Duration | 100 ms | 150 ms | 100 ms |

According to another exemplary embodiment, a method of determining a service phase of the electrical connection to a customer endpoint device may rely on synchronization accuracy in the mesh network to enable the relative phase of all meters on the feeder to be calculated.

The method includes identifying a group of endpoint devices that communicate directly with the same access point (AP), and forcing these endpoint devices to synchronize rapidly with the AP temporarily (e.g., about 10 minutes). Then, last zero-crossings may be detected at each endpoint device within a predetermined time period. A timestamp is associated with the last detected zero crossing in each endpoint device. The relative phase difference of the endpoint devices may be determined by calculating the difference between the timestamps of the last zero-crossings detected at the endpoint devices.

If the calculated difference between the timestamps is close to zero, then the customer endpoint devices are on the same service phase. If the calculated difference between the timestamps is close to 5.5 ms for a 60 Hz line or close to 6.6 ms for a 50 Hz line, then the relative phase difference between the customer endpoint devices is 120°. If the calculated difference between the timestamps is close to 11 ms for a 60 Hz line or close to 13.2 ms for a 50 Hz line, then the relative phase difference between the customer endpoint devices is 240°.

This procedure is repeated for different groups of meters. If overlapping pools of meters have been identified and chosen, then the relative phases of the meters on the entire feeder can be determined.

To get the "absolute" phase of the customer endpoint devices, the AP itself must be accurately synchronized for the short period of time. This may be done over Ethernet, cellular, or via GPS (Global Positioning System). The absolute phase may also be obtained by a secondary FSU (Field Service Unit) or by the AP being synchronized with an external source such as a GPS to determine the phase on one meter. The phases of the other meters may then be calculated based on the phase of the one meter.

The clock synchronization process is repeated for all of the meters in the network to develop a full phase connectivity model for the entire grid. The measurements are repeated periodically (e.g, at user-defined time intervals) to update the phase map of the grid network devices.

According to another exemplary embodiment, the service phase of the customer endpoint devices in the network may be determined based on phase shift relative to a host system. The host system can be any device that is capable of communicating with the endpoint devices. In exemplary embodiments, the host system may be the back office server or an AP. Both the customer endpoint device and the host system are capable of determining the time difference ("delta time ($\Delta$)") for any voltage positive/negative zero transitions relative to the time of originating a message to be sent to another device, or receiving a message from another device.

Figure 5:
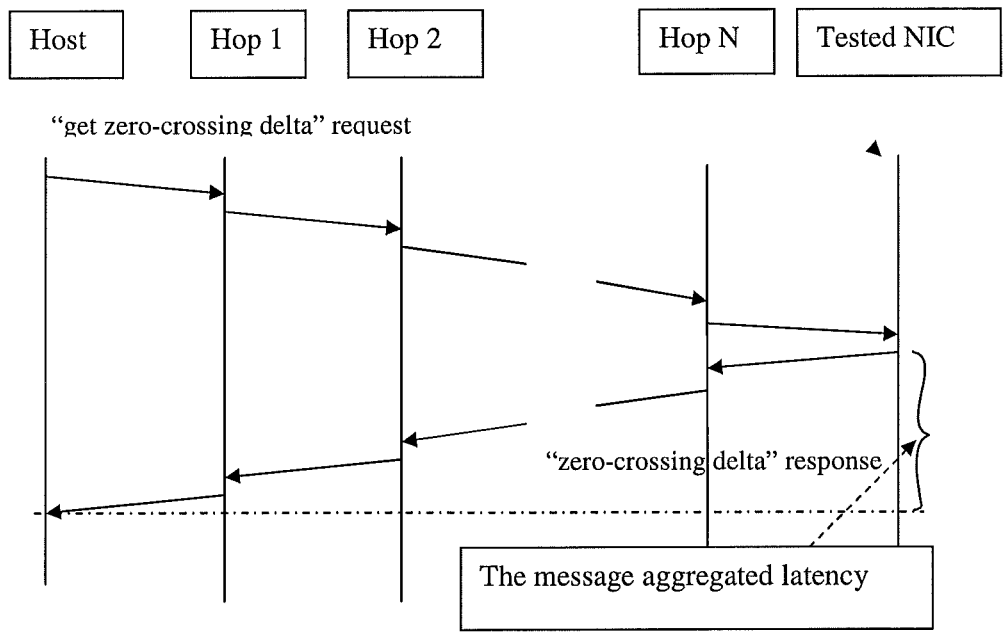

Referring to FIG. 5, the host system sends a "get zero-crossing delta" request to the NIC of the customer endpoint device. The NIC being queried obtains the requested data and sends a response.

Figure 6:
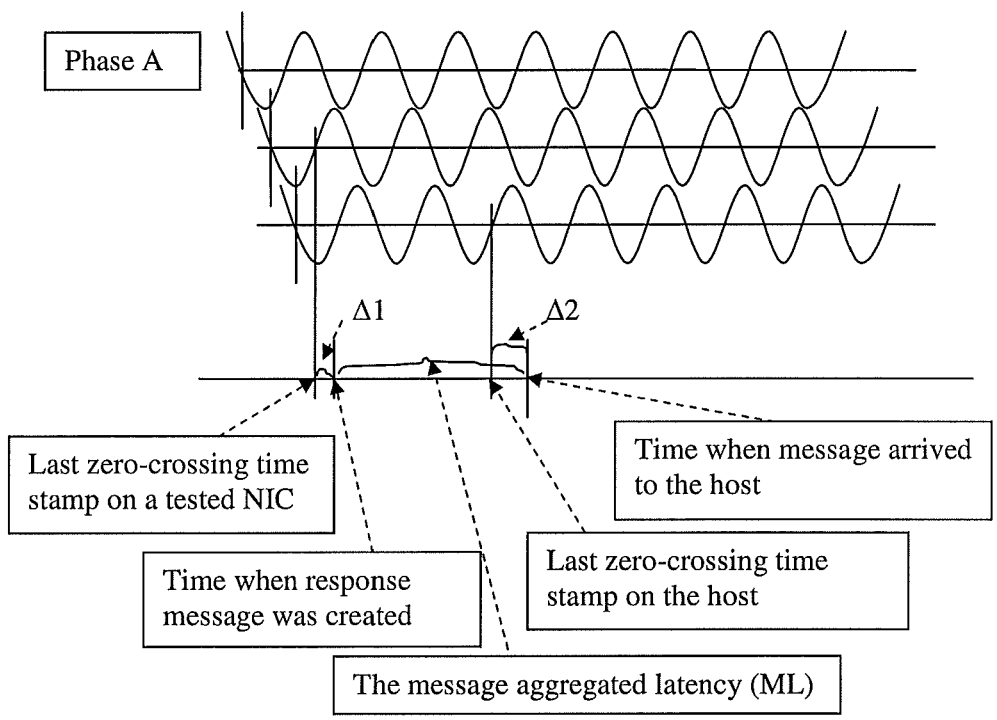

Referring to FIG. 6, when the NIC receives the "get zero-crossing delta" request from the host system, it calculates the difference between its current time and the timestamp of the last zero-crossing detected at the customer endpoint device. Once the difference ($\Delta 1$) is calculated, the NIC sends the response message to the host system. The response message includes a field for transmit latency. Each forwarding node along the path adjusts the latency by adding its own latency to the sender's latency number in the specified field (See FIG. 5). The sending node sends a response message along with the timestamp of the response message (indicating when the response message was created at the sending node). The total path latency can be calculated at the receiving node as the difference between the current time (i.e., the time when the response message is received at the receiving node) and the timestamp of the response message. The host system will receive the response message with message aggregated latency (ML).

Once the host system receives the response message, it calculates the difference between its current time and the timestamp of the last zero-crossing detected at the host system ($\Delta 2$). Then the phase shift ($\phi S$) may be calculated using the following equation:

$$\phi S = (\Delta 1 + ML - \Delta 2 + P) \bmod P, \quad [\text{Equation 1}]$$

where P is the line frequency period (16.6 mS for 60 Hz, 20 mS for 50 Hz), and mod is an operation that returns the remainder of a division operation (for example, 25 mod 20=5).

If $\phi S$ is close to zero, then both the host system and the NIC are on the same phase. If $\phi S$ is close to 5.5 mS for a 60 Hz line or 6.6 mS for a 50 Hz line, then the phase shift between the host system and the NIC is 120°. If $\phi S$ is close to 11 mS for a 60 Hz line or 13.2 mS for a 50 Hz line, then the phase shift between the host system and the NIC is 240°.

To get the "absolute" phase of the customer endpoint devices, the host system should have knowledge of its own phase (e.g., host system zero-crossing circuit should be receiving its power on a known phase).

The above process is repeated for all meters (NICs) in the network and the phase of each meter is thereby established. Since the phase of the host system is known, this process allows the phases of all the meters in the network reached by the host system to be mapped. This process will result in a full phase connectivity model for the grid in the network. For any devices which are not part of the network, manual testing may have to be conducted to determine the phase.

This process may be repeated periodically (i.e, at user-defined time intervals) for the entire network to update the phase map information.

According to another exemplary embodiment, the service phase of a customer endpoint device in the network may be determined based on phase shift relative to each of its direct neighbors (i.e., neighboring customer endpoint devices). Any two endpoint devices are capable of obtaining the time difference ("delta time ($\Delta$)") for any voltage positive/negative zero transitions relative to origination/receiving time of a message.

Figure 7:
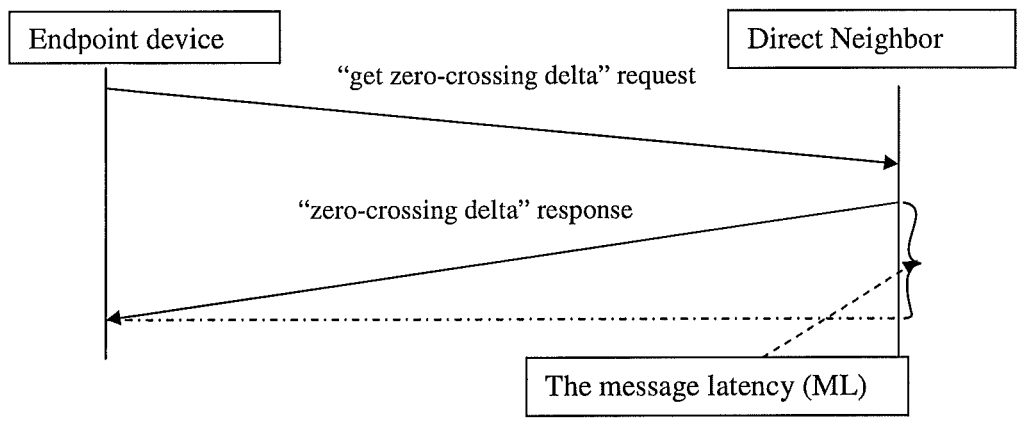

Referring to FIG. 7, an endpoint device sends a "get zero-crossing delta" request to its direct neighbor and receives a response from its neighbor. The "get zero-crossing delta" request may be a separate exchange or a part of a regular message exchange.

Figure 8:
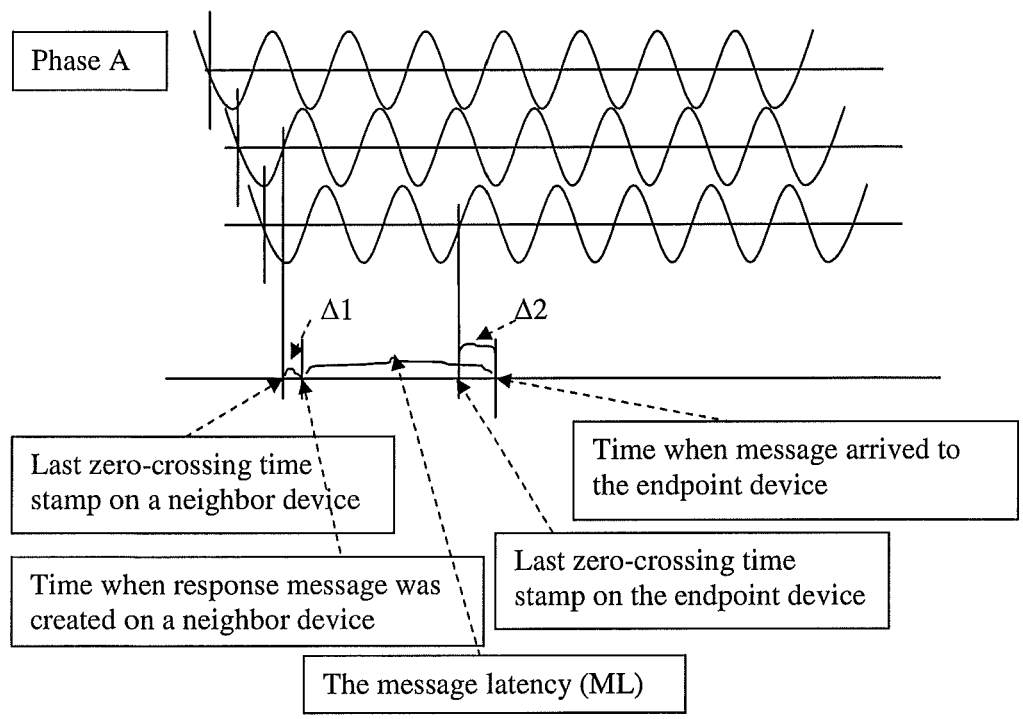

Referring to FIG. 8, when the neighboring device receives the "get zero-crossing delta" request, it calculates the difference between its current time and the timestamp of the last zero-crossing detected at that neighboring device ($\Delta 1$). Once the difference ($\Delta 1$) is calculated, the NIC of the neighboring device sends the response message to the originating endpoint device. The response message may have a field for the message latency (ML), which may be set by the PHY or MAC layers of the device's network communication interface. Alternatively, the message latency may be set to a constant value since it may be capable of being determined between direct neighbors, e.g., during a period of clock synchronization among network nodes.

Once the originating endpoint device receives the response message, it calculates the difference between its current time and the timestamp of the last zero-crossing detected at the originating endpoint device ($\Delta 2$). Then the phase shift ($\phi S$) may be calculated using Equation 1 above.

In the above exemplary embodiment, each device in the network may maintain the relative phase shift information for each of its direct neighbors. This information may be in the form of a table similar to a table maintained at a respective node listing the other nodes with which the respective node can communicate, e.g., a node queue, or may be maintained in a field in the node queue table itself. This information can be reported to the back office server, to enable a map of the service phase of each endpoint device in the grid to be developed.

The "get zero-crossing delta" exchange occurs between direct neighbors. It is not critical when this exchange should occur, but most likely it will happen at least once for every node after the node has been powered up and/or rebooted. Once each node has the relative phase shift information, the relative phase shift between any two nodes in the network may be easily obtained. For instance, node 2 may have a 120° phase shift relative to node 1 while node 3 has a 240° phase shift relative to node 2. The phase shift between an arbitrary node N and node 3 may be 0°. The phase shift between nodes 1 and 3 is 360° that is equivalent to 0° and therefore nodes 1, 3, and N belong to the same phase while node 2 has 120° phase shift relative to them. By knowing an "absolute" phase of any node, the "absolute" phase of every node may also be easily obtained. A reference node can be chosen, and it may establish its own absolute phase.

This exemplary embodiment provides a non-invasive method of phase determination (e.g., no sags, no power interruptions, and no missing periods of power). Thus, there is no need to add any special equipment to the grid. In addition, the entire grid's phase topology may be determined in a relatively short time with minor overhead (e.g., one short message upon the power-up to each neighbor or even a few bytes added to an existing power-up message). Also, this method does not require synchronizing the meter clock to the host clock.

It will be appreciated by those skilled in the art that the present invention can be embodied in other specific forms without departing from the spirit or essential characteristics thereof. The presently disclosed embodiments are therefore considered in all respects to be illustrative and not restricted.

What is claimed is:

1. A method of determining a service phase of an endpoint device in a power distribution system, the method comprising:
sending a message to a point in the power distribution system requesting a power line event affecting power quality on one of a plurality of power distribution phases of a feeder line to customer sites;
receiving a report from each of a plurality of endpoint devices at respective customer sites indicating that the requested power line event was detected by each of the plurality of endpoint devices; and
based on the received reports, mapping at least one endpoint device that reported the detection of the power line event to the respective phase on which the power line event was created, thus identifying which of the plurality of phases the feeder line of the endpoint device is serviced by.

2. The method of claim 1, wherein the point in the power distribution system to which the message is sent is a substation.

3. The method of claim 1, wherein the plurality of endpoint devices are programmed to detect, log, and report power line events.

4. The method of claim 1, wherein the plurality of endpoint devices detect the power line event by monitoring missed zero crossings in alternating current power within a predetermined time period.

5. The method of claim 1, wherein the power line event is induced serially on each phase of the feeder line at a given time for a predetermined period of time.

6. The method of claim 5, wherein the mapping of the endpoint device is performed at a back office server having information pertaining to the power line event being induced on a particular phase, and based on the reports received from the end-point devices, the back office server links the endpoint device reporting the power line event at the given time to the particular phase.

7. The method of claim 1, wherein a single power line event is detected when the endpoint device measures a zero-crossing for a period of time that is less than a predetermined maximum time period and longer than a predetermined minimum time period.

8. The method of claim 7, wherein the maximum time period is determined so that a device, to which the power is supplied, avoids reacting to the power line event as a loss of power.

9. The method of claim 7, wherein duration of a power line event for the predetermined minimum time period causes the endpoint devices to measure zero-crossing data, and send a report containing the measured data.

10. The method of claim 1, wherein the power line event is a temporary power interruption.

* * * * *